United States Patent

Kamiya

Patent Number: 5,273,192
Date of Patent: Dec. 28, 1993

[54] RESIST LAYER APPLICATION APPARATUS

[75] Inventor: Masayuki Kamiya, Kanagawa, Japan

[73] Assignee: Sony Corporation, Japan

[21] Appl. No.: 895,659

[22] Filed: Jun. 9, 1992

[30] Foreign Application Priority Data

Jun. 27, 1991 [JP] Japan ................................ 3-156391

[51] Int. Cl.$^5$ .............................................. B67B 5/00
[52] U.S. Cl. ................................................. 222/152
[58] Field of Search ............... 222/152, 49, 133, 148, 222/251, 263, 282, 310, 372, 394, 481

[56] References Cited

U.S. PATENT DOCUMENTS

| | | | |
|---|---|---|---|
| 3,018,021 | 1/1962 | Gorand et al. | 222/152 |
| 4,285,445 | 8/1981 | Vander Molen et al. | 222/152 |
| 4,726,494 | 2/1988 | Scott | 222/152 |
| 4,982,876 | 1/1991 | Scott | 222/152 |

FOREIGN PATENT DOCUMENTS 2-160074  6/1990  Japan .

*Primary Examiner*—David M. Mitchell
*Assistant Examiner*—Stephen P. Avila
*Attorney, Agent, or Firm*—Ronald P. Kananen

[57] ABSTRACT

An apparatus for spraying a photo-resist comprises a resist supply reservoir, a pump and a supply line from the pump to a nozzle. Further provided is a standby receptacle into which an end portion of the nozzle is inserted when not being utilized in a spraying operation. The standby receptacle is supplied with $N_2$ gas, bubbled through a solvent which is held at a bottom portion of the container, surrounded by an air space. The nozzle rests in a nozzle holder so as to be exposed to the internal atmosphere of the container for preventing clogging of the nozzle due to drying of the solvent when the nozzle is not in use.

20 Claims, 3 Drawing Sheets

RESIST LAYER APPLICATION APPARATUS

BACKGROUND OF THE INVENTION

1. Field of the Invention

The present invention relates generally to an apparatus for spraying a resist film. Particularly, the present invention relates to an apparatus for spraying resist film which can prevent hardening of the resist in a spray nozzle of the apparatus during a standby period between spraying operations.

2. Description of the Prior Art

An apparatus for spraying a photo-resist for semiconductor manufacture is known which comprises a resist supply reservoir, a pump, and a nozzle for spraying resist onto a workpiece. Further provided is a standby receptacle for retaining the spray nozzle when not in use.

Referring to FIG. 5, such a conventional standby receptacle. As can been seen from the drawing, the conventional standby receptacle comprises a receptacle body 1, and an interior tank 1B filled with a solvent 3. A solvent supply line 4 and a receptacle drain line 5 are also provided. At an upper portion of the receptacle body 1 is a nozzle retaining portion 1A for holding the nozzle exposed to an interior atmosphere 3a of the standby receptacle for preventing resist present in the nozzle from hardening within the nozzle during periods when the nozzle is not used.

However, in such conventional standby receptacles, an atmospheric concentration of solvent is substantially low which compromises the efficiency of the apparatus. Also leakage of the interior atmosphere of the receptacle can occur which increases an amount of solvent which must be used. Further, dissolved resist from the nozzle can drip into the interior tank 1B of the receptacle thus requiring high maintenance.

SUMMARY OF THE INVENTION

It is therefore a principal object of the present invention to overcome the drawbacks of the prior art.

It is a further object of the present invention to provide a spray apparatus in which a spray medium will not harden within a nozzle thereof when the nozzle is not in use.

In order to accomplish the aforementioned and other objects, a resist application apparatus is provided, comprising: a resist container, pump means connected to the resist container via a pipe, resist medium supply means connecting from the pump means a working position of the apparatus, a nozzle connected at a distal end of the spray medium supply means, the nozzle being movable between at least first and second positions, a standby receptacle having an interior space defined therein, an interior tank disposed in a lower portion of the interior space of the standby receptacle, the interior tank containing solvent a gas supply line connected to the interior tank, and nozzle retaining means positioned on an outer surface of the standby container and communicating with the interior space and corresponding to one of the first or second positions of the nozzle.

DESCRIPTION OF THE PREFERRED EMBODIMENT

Figure 1:
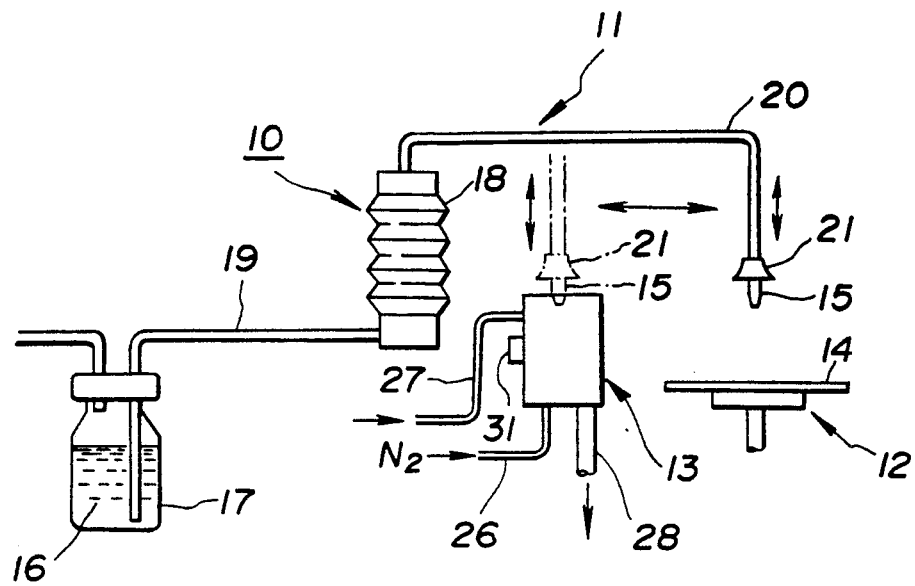
FIG. 1 is a schematic diagram of a spray apparatus of the invention.

Referring now to the drawings, particularly to FIG. 1, a resist spraying apparatus 10 according to the invention is shown. The arrangement shown in FIG. 1 comprises a resist supply means 11, such as a tube or pipe, for example, a wafer 14 onto which a resist medium is to be applied, a rotatable support 12 which rotatably supports the wafer in a working position, and a spray nozzle 15 connected to an end of the resist supply means 11.

In detail, the resist supply means 11 comprises a resist container 17 containing a resist medium 16 (hereinafter photo-resist by way of example). The resist medium 16 is drawn from the resist container 17, through a conduit, or pipe 19, which is connected into the resist container 17 to draw the photo-resist 16 from a bottom area thereof, to a pump 18, such as a bellows pump, for example, and through a pipe, or tube 20 to the nozzle 15. The nozzle includes an annular sealing ring 21 at a point where the nozzle 15 connects to the pipe 20.

Thus the photo-resist is supplied to the nozzle 15 for applying the photo-resist 16 to a workpiece, or wafer 14, which is rotatably mounted on a rotatable workpiece mounting portion 12. Proximate the workpiece mounting portion 12 is a standby receptacle 13 for receiving the nozzle 15 when the nozzle 15 is not in use.

The standby receptacle 13 will be described in detail hereinbelow with reference to FIG. 2.

The standby receptacle 13 comprises a receptacle body 22, in which an interior tank 23 within the receptacle body is defined by a bottom portion of the tank which is divided from the remainder thereof by a partition. The interior space of the interior tank 23 is filled with a solvent 24. At a bottom portion of the interior of the receptacle body not within the interior tank 23, that is at a bottom portion at a side of the partition which is exposed to the ambient atmosphere of the receptacle interior, a drain pipe 28 is connected leading out of the receptacle. An air space 30 is defined by the interior space of the receptacle 22 other than the space occupied by the interior tank 23.

Further, a pipe 26 carrying a gas, such as $N_2$ for example, is connected to a lower, interior portion within the interior tank 23. That is to say, a gas pipe 26 is provided for carrying $N_2$ to a bottom portion of the interior tank 23 for causing the $N_2$ gas to be bubbled through the solvent 24 held within the partitioned area.

At the bottom portion of the interior tank 23, disposed on the horizontal plane, a net 25 is provided for dispersing the $N_2$ gas throughout the solvent. Thus, as the $N_2$ gas is introduced to the solvent 24 in the interior tank 23, the net 25 disperses the $N_2$ gas substantially evenly through the solvent in the form of bubbles 32. According to the above, an atmospheric density of the solvent 24 in the air space 30 of the receptacle body 22 is increased, accordingly a liquid volume of the solvent 24 in the interior tank is decreased. To prevent depletion of the liquid solvent 24, a solvent supply tube 27 is introduced into the receptacle body 22 at a position just above the interior tank 23 to replenish the solvent supply at an appropriate rate.

At an upper part of the receptacle body 22, a nozzle retaining portion 29 is provided. The nozzle retaining portion 29 is an opening which allows a tip end of the nozzle 15 to be exposed to the air space 30 of the receptacle 22 and thus to the high atmospheric volume of the solvent 24, as discussed above. When the nozzle positioned at the nozzle retaining portion 29 it is sealed in the atmosphere within the air space 30 by the annular sealing ring 21.

Figure 2:
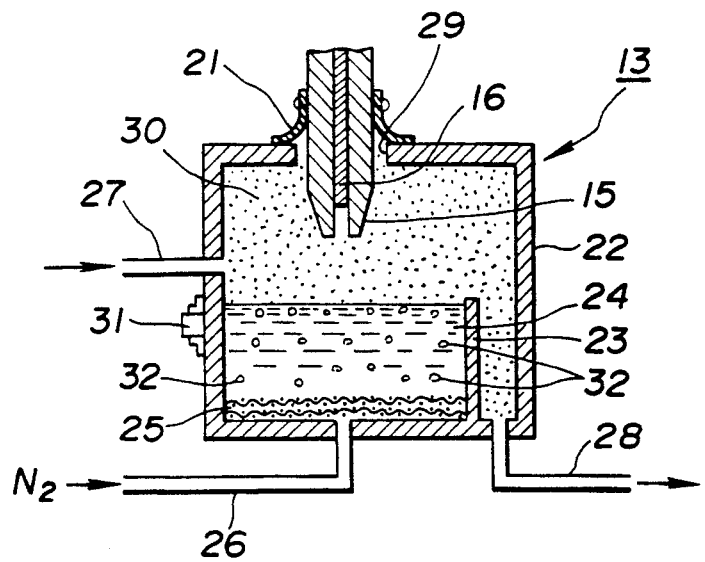
FIG. 2 is a cross sectional view of a first embodiment of an interior arrangement of a standby container of the invention.

In this condition, as seen in FIG. 2, the nozzle 15, containing photo-resist 16 therein, is exposed to the interior atmosphere of the standby-receptacle 13 which contains a high concentration of solvent. In this state, solvent 16 present in the tip end of the nozzle 15 is prevented from hardening. Thus the resist spraying apparatus according to the invention can remain unclogged over long periods of use and requires substantially less maintenance than conventional arrangements.

Figure 3:
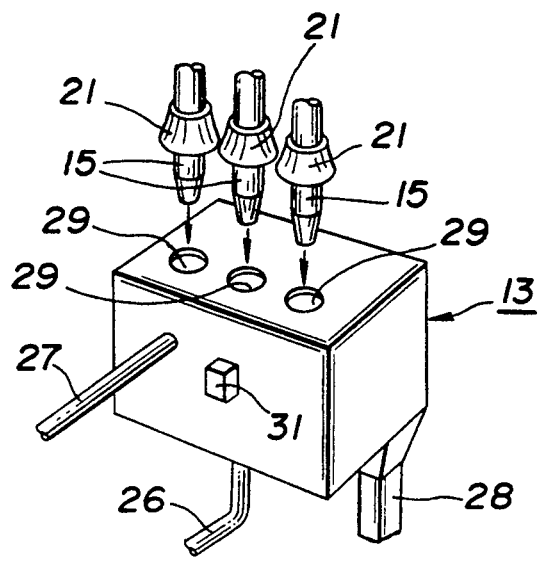
FIG. 3 is a perspective view of an alternative embodiment of a standby container which may accommodate a plurality of nozzles.

FIG. 3 shows an alternative embodiment of a standby receptacle according to the invention. According to this embodiment, a plurality of nozzle retaining portions 29 are provided to accommodate a plurality of nozzles 15 and, a solvent volume sensor 31 is employed for determining when to replenish the liquid solvent via the solvent supply tube 27.

Further, although $N_2$ gas is utilized in the above embodiment, other types of gas may also be employed.

Figure 4:
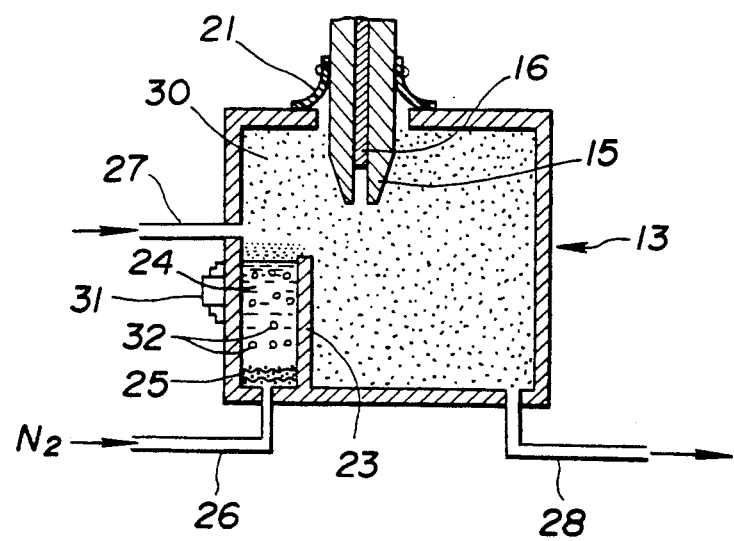
FIG. 4 is a cross-sectional view of a second embodiment of an interior arrangement of a standby container.
Figure 5:
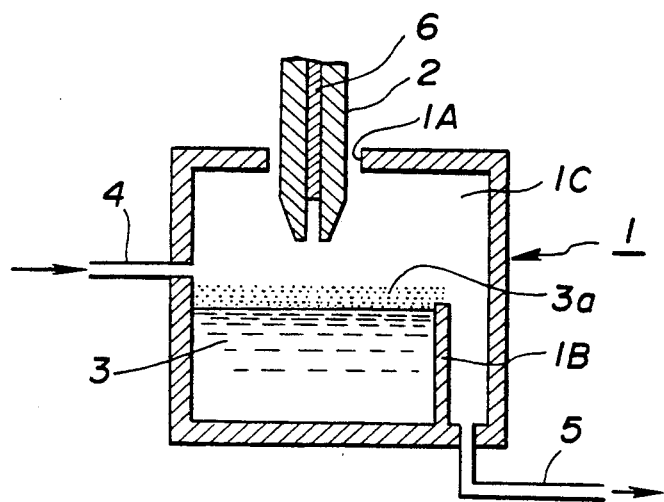
FIG. 5 is a cross-sectional view of an interior arrangement of a standby container of a conventional resist spraying apparatus.

In addition, if the standby position of the nozzle is established lower than the working position and the standby position of the nozzle 15 in the nozzle retaining portion 29 of the receptacle body 22 is aligned with the drain pipe 28, or, as shown in FIG. 4, of the nozzle 15 in the standby position is positioned so as to be over an area other than the interior tank 23, excess photo-resist which tends to drip from the nozzle 15 in a standby state can be drained by the solvent drain pipe 28 to enhance the overall efficiency of the apparatus.

Also, though the above-described embodiment utilizes a bellows pump, any other type of suitable pump may alternatively by employed.

Although the embodiment discloses a sealing ring 21 attached around the nozzle 15 for movement therewith, the sealing ring 21 may alternatively be mounted around the nozzle retaining portion 29 of the standby receptacle 13.

Moreover, though the gas pipe 26 introduces gas from a bottom portion of the interior tank 23, the gas may also be introduced by bubbling, for example, from a position other than the bottom portion.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A resist application apparatus, comprising:
   a resist container;
   pump means connected to said resist container via a pipe;
   resist medium supply means connecting from said pump means to a working position of said apparatus;
   a nozzle connected at a distal end of said spray medium supply means, said nozzle being movable between at least first and second positions;
   a standby receptacle having an interior space defined therein;
   an interior tank disposed in a lower portion of said interior space of said standby receptacle, said interior tank containing solvent therein;
   a gas supply line connected to said interior tank;
   nozzle retaining means positioned on an outer surface of said standby container and communicating with said interior space and corresponding to one of said first or second positions of said nozzle;
   a solvent supply line connecting into said interior space at a position over and proximate said interior tank and supplying liquid solvent to said interior tank at a predetermined rate; and
   a sensor which measures a volume of solvent in said interior tank for establishing said predetermined rate.

2. A resist application apparatus as set forth in claim 1, further including a drain line connected to said interior space In said standby receptacle.

3. A resist application apparatus as set forth in claim 2, wherein said drain line is connected to a bottom portion of said standby receptacle.

4. A resist application apparatus as set forth in claim 2, wherein said nozzle retaining means is aligned vertically with said drain line connecting to the interior space of said standby receptacle.

5. A resist application apparatus as set forth in claim 1, further including a work area for retaining a work piece corresponding to the other of said first or second positions.

6. A resist application apparatus as set forth in claim 1, wherein said interior tank is formed by a vertical partition formed in the bottom of said interior space of said standby receptacle.

7. A resist application apparatus as set forth in claim 1, wherein said pump means is a bellows pump.

8. A resist application apparatus as set forth in claim 1, wherein said interior tank is positioned within said receptacle so as to be vertically unaligned with said nozzle retaining means.

9. A resist application apparatus as set forth in claim 1, wherein said gas is $N_2$.

10. A resist application apparatus as set forth in claim 1, further including sealing means associated with said nozzle, said nozzle sealingly engaging said nozzle retaining means thereby.

11. A resist application apparatus as set forth in claim 1, further including sealing means associated with said nozzle retaining means, said nozzle sealingly engaging said nozzle retaining means thereby.

12. A resist application apparatus, comprising:
    a resist container;
    pump means connected to said resist container via a pipe;
    resist medium supply means connecting from said pump means to a working position of said apparatus;

a nozzle connected at a distal end of said spray medium supply means, said nozzle movable between at least first and second positions;

a standby receptacle having an interior space defined therein;

an interior tank disposed in a lower portion or said interior space of said standby receptacle, said interior tank containing solvent therein;

a gas supply line connected to said interior tank;

nozzle retaining means positioned on an outer surface of said standby container and communicating with said interior space and corresponding to one of said first or second positions of aid nozzle; and a net being provided at a lower portion of said interior tank between said interior space and said gas supply line.

13. A resist application apparatus comprising:

a resist supply means having a nozzle at an end thereof for supplying resist to a point of application;

a pump means for pumping resist from a resist container and supplying said resist to said resist supply means, a standby means having an interior space defined therein for receiving said nozzle when in a standby sate, said standby means including a retaining means for retaining said nozzle and a sealing means for sealingly retaining said nozzle, wherein said standby means includes an interior tank disposed in said interior space, a solvent supply line for supplying a solvent, a sensor which measures a volume of aid solvent in said interior tank for establishing a predetermined rate, a drain line for draining said solvent, a gas supply line connected to said interior tank for a gas supply into said solvent and a net being provided at bottom portion of said interior tank for bubbling said solvent by said gas so as to promote volatilization and then diffusion of said solvent.

14. A resist application apparatus, comprising:

a resist supply means connected to a pump means for pumping up said resist from a resist container and supplying said resist to said resist supply means, and said resist supply means having a nozzle at an end of said resist supply means; and a standby means having an interior space defined therein, and including a retaining means for retaining said nozzle, wherein said standby means includes an interior tank disposed in said interior space, a gas supply line connected to said interior tank for a gas supply into said solvent so as to promote volatilization and then diffusion of said solvent.

15. A resist application apparatus as set forth in claim 14, wherein said gas is an inert gas.

16. A resist application apparatus as set forth in claim 14, wherein said gas in $N_2$ gas.

17. A resist application apparatus as set forth in claim 14, further including means for bubbling said gas through said solvent being provided at a bottom portion of said interior tank.

18. A resist application apparatus as set forth in claim 17, wherein said means for bubbling is a net being provided at a bottom portion of said interior tank.

19. A resist application apparatus as set forth in claim 14, further including sealing means associated with said nozzle, said nozzle sealingly engaging said nozzle retaining means thereby.

20. A resist application apparatus as set forth in claim 14, further including sealing means associated with said nozzle retaining means, said nozzle sealingly engaging said nozzle retaining means thereby.

* * * * *